United States Patent [19]

Nakao et al.

[11] Patent Number: 5,229,576

[45] Date of Patent: Jul. 20, 1993

[54] HEATING APPARATUS

[75] Inventors: Ken Nakao, Tokyo; Seiji Sakurai, Yokohama; Yoshihisa Miyahara, Yokohama; Yoshiyuki Motoyoshi, Yokohama, all of Japan

[73] Assignee: Tokyo Electron Sagami Limited, Kanagawa, Japan

[21] Appl. No.: 842,984

[22] Filed: Feb. 28, 1992

[30] Foreign Application Priority Data

Feb. 28, 1991 [JP] Japan .................................. 3-59710

[51] Int. Cl.[5] ............................................ H05B 3/64
[52] U.S. Cl. ...................................... 219/390; 219/388
[58] Field of Search ............... 219/390, 405, 411, 388; 501/133, 153, 154

[56] References Cited

U.S. PATENT DOCUMENTS

| | | | |
|---|---|---|---|
| 3,361,863 | 1/1968 | Lang | 219/390 |
| 4,699,084 | 10/1987 | Wilson | 219/390 |
| 4,857,489 | 8/1989 | Bearden | 501/133 |
| 5,038,019 | 8/1991 | McEntire | 219/390 |

*Primary Examiner*—Teresa J. Walberg
*Attorney, Agent, or Firm*—Oblon, Spivak, McClelland, Maier & Neustadt

[57] ABSTRACT

A heating apparatus provided with a double layered heat-insulating material. This heat-insulating material includes an inner layer portion constituted by an alumina fiber/inorganic filler/inorganic binder and having a bulk density of 0.3 to 0.8 g/cm$^3$, and an outer layer portion integrally laminated on the inner layer portion, and constituted by an alumina silica fiber/ inorganic binder and having a bulk density of 0.2 to 0.4 g/cm$^3$ which is smaller than that of the inner layer portion.

10 Claims, 7 Drawing Sheets

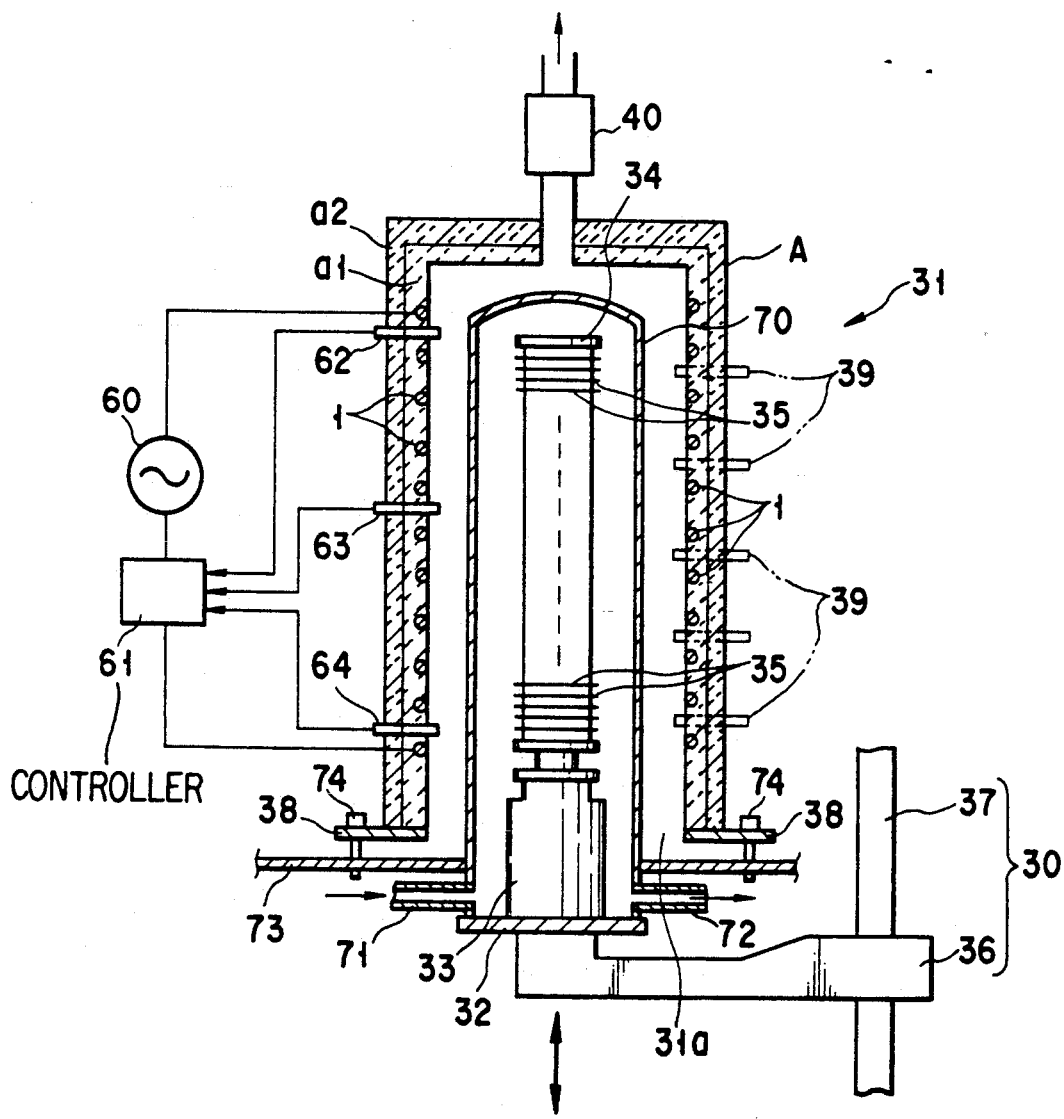
F I G. 6

HEATING APPARATUS

BACKGROUND OF THE INVENTION

1. Field of the Invention

The present invention relates to a heating apparatus in which a heating member is supported by a heat-insulating material and, more particularly, to a heating apparatus mainly suitable for use in a semiconductor manufacturing process.

2. Description of the Related Art

In a process for manufacturing a semiconductor, e.g., a transistor and an IC, a diffusion furnace, in which a furnace core tube is surrounded by a cylindrical member constituted by a heat-insulating material and a heating coil is supported on the inner surface of the cylindrical member, is conventionally often used as a heating apparatus for diffusing impurities on the silicon substrate.

The cylindrical member for supporting the heating coil is constituted by heat-insulating bricks. Recently, in order to reduce the size and weight of the apparatus and to minimize external heat dissipation, a product mainly containing, e.g., an alumina fiber having a bulk density of 0.3 g/cm$^3$ and a small heat conductivity is often used as the material of the cylindrical member.

Although the alumina fiber is optimum as the heat-insulating material of the diffusion furnace, since its bulk density is large, its heat capacity is large, and it takes a long period of time to increase or decrease the temperature in the furnace. As the diameter of a semiconductor wafer is increased (e.g., from 4 inches to 6 inches and then to 8 inches), the size of the heating apparatus is also increased, and the weight of the heating apparatus is also increased Hence, it is demanded to reduce the weight of the heating apparatus.

SUMMARY OF THE INVENTION

It is an object of the present invention to provide a heating apparatus having a heat-insulating layer which exhibits an excellent heat resistance and excellent heat-insulating properties in, e.g., a high temperature range of about 1,200° C. or in a low temperature range of about 500° C., thus having a small heat capacity, so that time required for increasing and decreasing a furnace temperature can be shortened.

As a means for achieving the above object, according to the present invention, there is provided a heating apparatus comprising an integral layer including an inner layer portion constituted by an alumina fiber/inorganic filler/inorganic binder and having a bulk density of 0.3 to 0.8 g/cm$^3$ and an outer layer portion constituted by an alumina silica fiber/inorganic binder and having a bulk density of 0.2 to 0.4 g/cm$^3$ which is smaller than that of the inner layer portion, wherein the inner layer portion serves as a support portion of a heating member.

In the heating apparatus having the heat-insulating layer having the above arrangement, since the inner layer portion supporting the heating member is formed as a heat-insulating layer using an alumina fiber and having a relatively high density, it exhibits an excellent heat resistance and excellent heat-insulating properties together with the outer layer portion at a high temperature region. Although the outer layer portion is made of a heat-insulating layer having a low density, it exhibits excellent heat-insulating properties in a low temperature region when compared to the inner layer portion.

Although the inner and outer layer portions are made of different materials, since they form the integral layer substantially having no joint, they will not be undesirably separated from each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 6 is a partial sectional view showing in detail a furnace of the CVD system shown in FIG. 5;

DETAILED DESCRIPTION OF THE PREFERRED EMBODIMENTS

Figure 1:
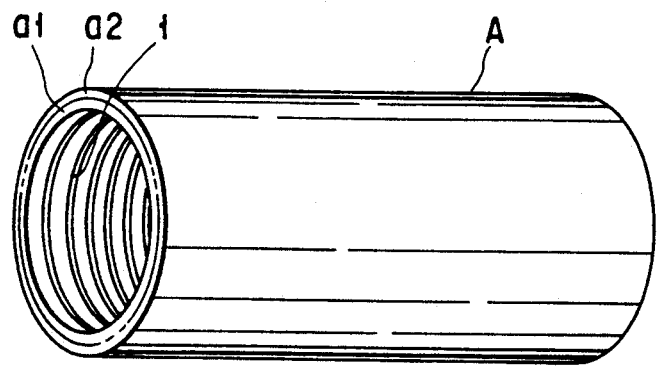
FIG. 1 is a perspective view showing a heating apparatus according to an embodiment of the present invention.
Figure 2:
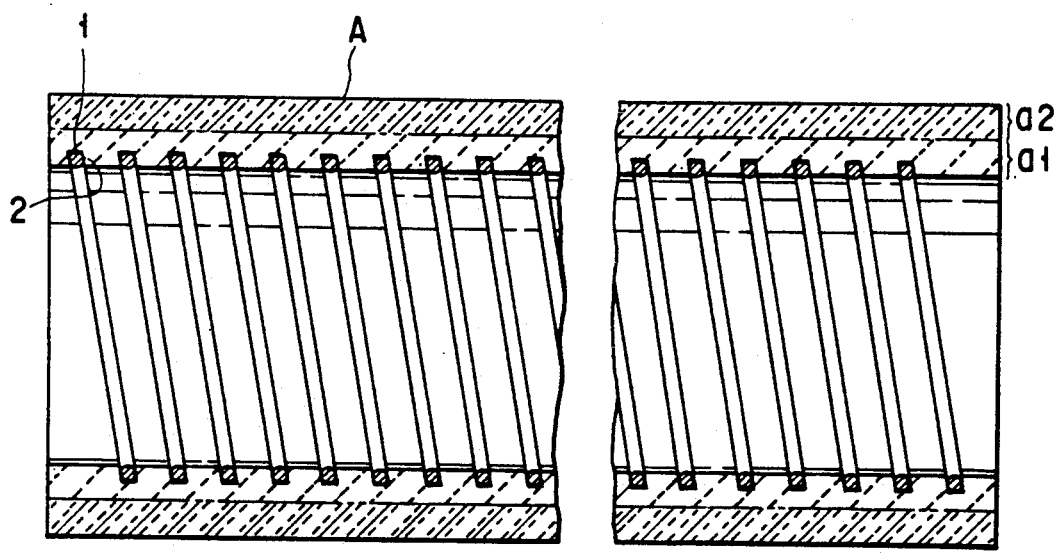
FIG. 2 is an enlarged sectional view showing the heating apparatus shown in FIG. 1.

FIGS. 1 and 2 show a heating apparatus according to an embodiment of the present invention. Referring to FIGS. 1 and 2, a heat-insulating cylindrical member A carries a heating member. The heat-insulating cylindrical member A consists of inner and outer layer portions $a_1$ and $a_2$ formed as an integral layer without a joint. The inner layer portion al is obtained by adding an inorganic filler and an inorganic binder to an alumina fiber as a major component, and the outer layer portion $a_2$ is obtained by adding an inorganic binder to an alumina silica fiber as a major component. On the inner circumferential surface of the inner layer portion $a_1$, a heating coil 1 is fitted in a spiral groove formed during formation of the inner layer portion $a_1$.

The alumina fiber as defined in this specification includes a fiber containing alumina as a major component, e.g., a fiber containing 78 wt % or more of alumina and an inorganic fiber such as silica.

The inorganic filler is used to increase the bulk density of the inner layer portion $a_1$. A refractory inorganic powder, e.g., an alumina powder, a magnesia powder, and a silica powder can be used as the inorganic filler.

As for the inorganic binder, any of the conventionally known materials, e.g., colloidal silica, colloidal alumina, sodium silicate, a zirconia sol, and a metal oxide sol can be arbitrarily used.

The thickness of the inner layer portion $a_1$ is not specifically limited and usually can be about 20 mm. Also, the thickness of the inner layer portion $a_2$ is not specifically limited and usually can be about 20 mm.

The mixing ratio of the alumina fiber/inorganic filler/inorganic binder constituting the inner layer portion $a_1$ is preferably set to 20 to 65/35 to 70/3 to 10 (parts by weight) so that the bulk density of the fiber layer after formation becomes 0.3 to 0.8 g/cm$^3$. If the bulk density is less than 0.3 g/cm$^3$, the heat conductivity at a high temperature, e.g., 1,000° C. becomes large, and the heat-insulating characteristics are impaired. If the bulk density exceeds 0.8 g/cm$^3$, cracking tends to occur after formation, the heat conductivity at a high temperature, e.g., 1,000° C. becomes large, and both the heat capacity and the weight become large.

The mixing ratio of the alumina silica fiber/inorganic binder constituting the outer layer portion $a_2$ is preferably set to 85 to 95/5 to 15 (parts by weight) so that the bulk density of the fiber layer after formation becomes 0.2 to 0.4 g/cm$^3$, and smaller than that of the inner layer portion $a_1$. If the bulk density is less than 0.2 g/cm$^3$, it becomes difficult to retain the inner layer portion $a_1$ having a large weight and the heating coil 1, and the heat conductivity at a low temperature, e.g., about 600° C. becomes large. If the bulk density exceeds 0.4 g/cm$^3$, both the heat capacity and the weight become large. Since the heat capacity is determined by the weight and specific heat of the heat-insulating material, it is preferable to use a heat-insulating material having a small bulk density so that the heat capacity can be decreased.

Figure 3:
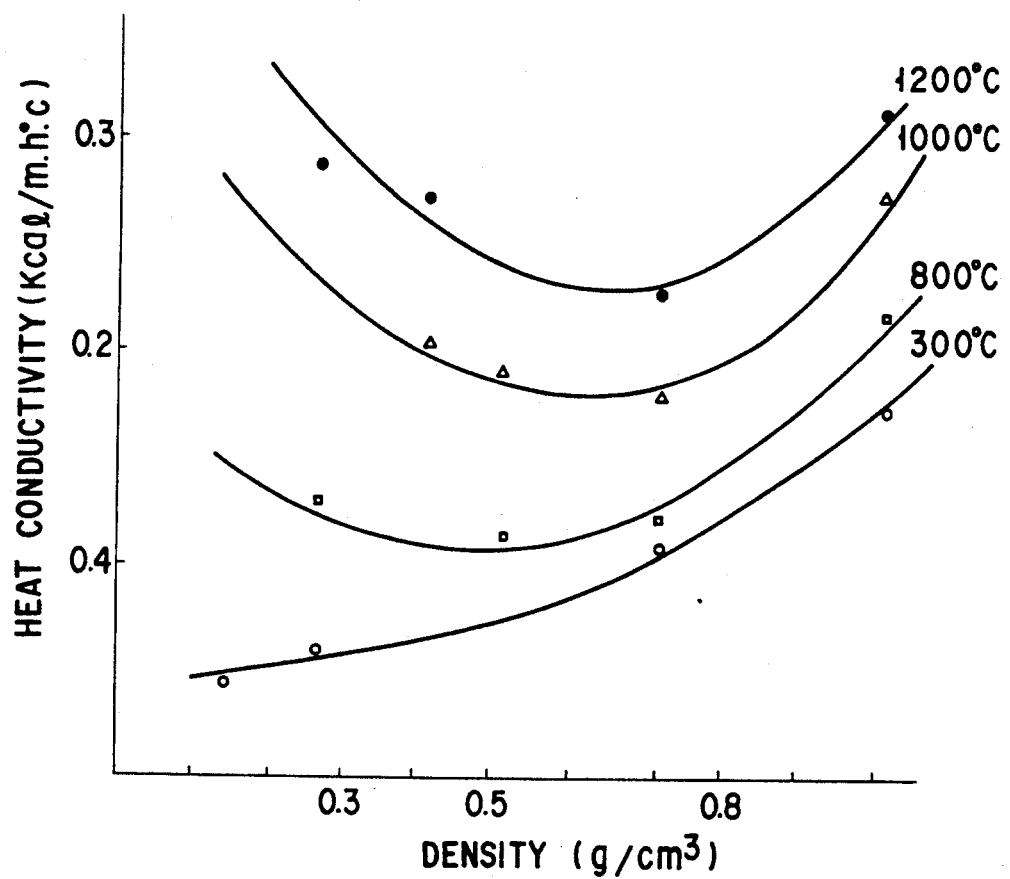
FIG. 3 is a graph showing a relationship between a bulk density of a heat-insulating layer and a heat conductivity.

The graph of FIG. 3 indicates the measurement results of the heat conductivity of the inner and outer layer portions $a_1$ and $a_2$. As is apparent from this graph, in the high temperature region, the heat conductivity becomes small when the bulk density falls within a range of 0.3 to 0.8 g/cm$^3$, and in the low temperature region, a low-heat conductivity region is slightly shifted to the low-density side.

Note that the alumina fiber of the inner layer portion $a_1$ can be partially replaced by the alumina silica fiber. In this case, the mixing ratio of the alumina fiber/alumina silica fiber/inorganic filler/inorganic binder is preferably set to 5 to 20/15 to 45/35 to 70/3 to 10 (parts by weight).

The heat-insulating cylindrical member shown in FIGS. 1 and 2 having the above arrangement is obtained in accordance with the following method.

An inorganic filler, an inorganic binder, and water are added to an alumina fiber to prepare a fiber dispersion. A cylindrical suction filtering member is dipped in the fiber dispersion. The cylindrical member is coupled to a vacuum generator and the vacuum generator is operated for a predetermined period of time, thereby vacuum-forming a fiber layer having a required thickness on an outer side of the cylindrical member. Prior to the vacuum formation, a predetermined mold is disposed on the outer side of the cylindrical filtering member to form a spiral groove 2 to be fitted with the heating coil 1 on the inner surface of the fiber layer. The fiber layer having the spiral groove 2 serves as the inner layer portion $a_1$.

Then, an inorganic binder and water are added to an alumina silica fiber to prepare a fiber dispersion. The cylindrical member having the fiber layer is dipped in the fiber dispersion. The cylindrical member is coupled to the vacuum generator as in the above manner and the vacuum generator is operated, thereby vacuum-forming a fiber layer on an outer side of the fiber layer of the inner layer portion $a_1$. This fiber layer serves as the outer layer portion $a_2$.

Since the inner layer portion $a_1$ and the outer layer portion $a_2$ surrounding it are formed as an integral layer substantially having no joint, if it is removed from the cylindrical filtering member and heated and dried at, e.g., 105° C. for 16 hours, the desired heat-insulating member can be obtained.

The heating coil 1 is fitted and fixed in the spiral groove 2 on the inner layer portion $a_2$ of the heat-insulating cylindrical member A to obtain the heating apparatus shown in FIGS. 1 and 2.

Figure 4:
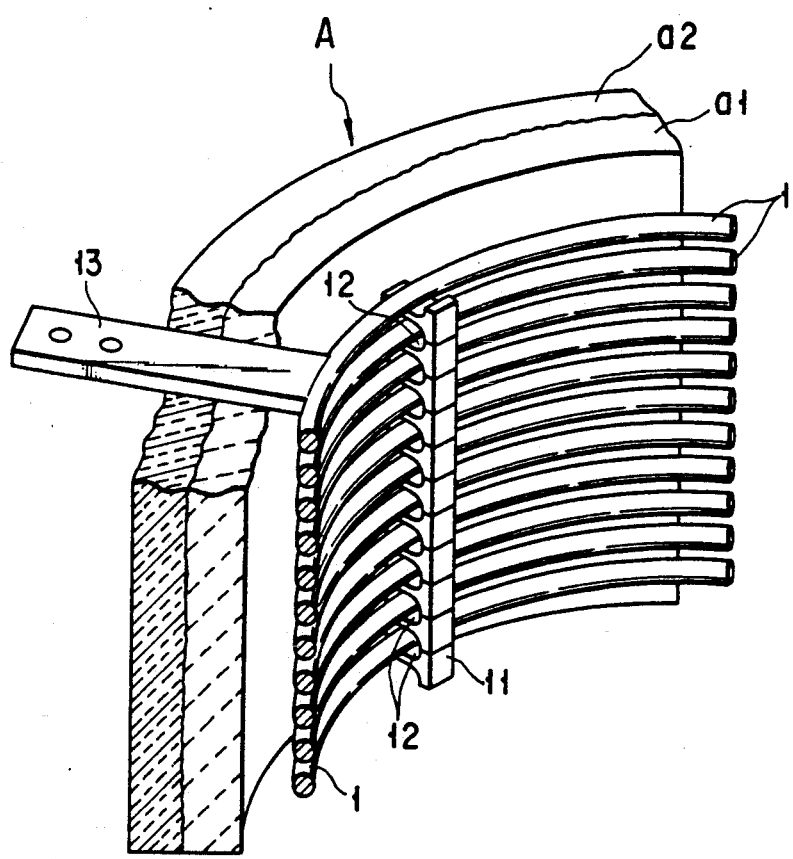
FIG. 4 is a perspective view showing a main part of a heating apparatus according to another embodiment of the present invention.

FIG. 4 shows a heating apparatus according to another embodiment of the present invention. In this embodiment, a heating coil 1 is fixed on a heat-insulating cylindrical member A through a fixing member 11 projecting from the inner wall of an inner layer portion $a_1$. That is, a multiple of guide holes 12 are formed in the fixing member 11, and the heating coil 1 is inserted in and supported by the respective guide holes 12. Reference numeral 13 denotes a terminal connected to the heating coil 1.

The heating apparatus according to the present invention is suitable for heating in a temperature range of, e.g., 300° to 1,200° C., and preferably in a temperature range of 500° to 1,200° C. This heating apparatus is used for heating in the process of a semiconductor wafer shown in, e.g., U.S. patent application No. 693,728 (filed on Apr. 30, 1991).

Figure 5:
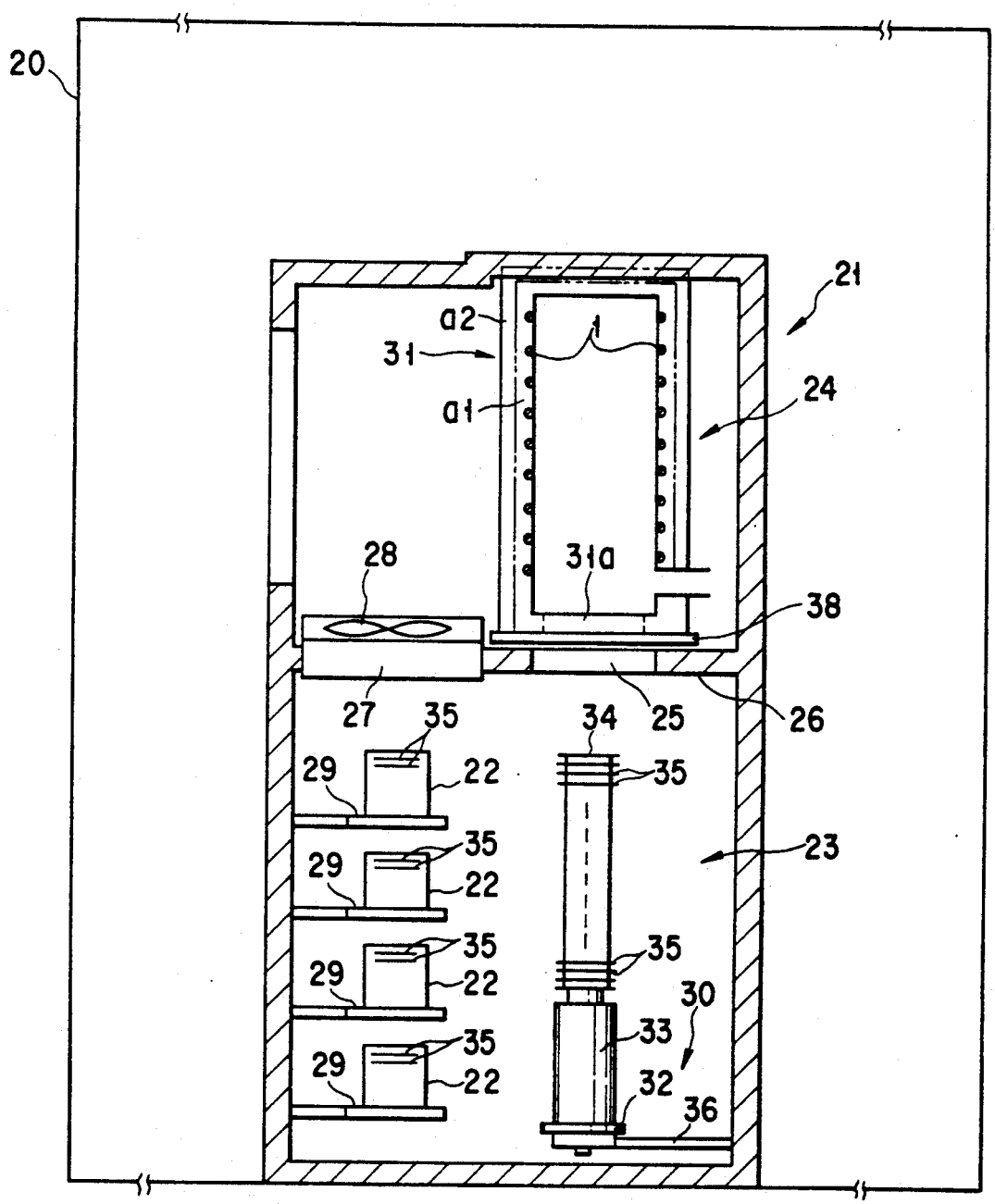
FIG. 5 is a partial sectional view showing the heating apparatus according to the present invention adopted by a vertical CVD system.

FIG. 5 shows a practical arrangement when the heating apparatus according to the present invention is adopted by a vertical CVD system.

A vertical CVD system 21 is a full-automatic system provided in a clean room 20 and backed up by a computer system. The whole operation of the vertical CVD system 21 is automatically controlled. A rail (not shown) of a handling robot is disposed in front of the vertical CVD system 21, and a wafer cassette 22 is transferred to the interior of a wafer transfer section 23 of the CVD system 21 by a robot (not shown).

A process section 24 of the vertical CVD system 21 is provided above the wafer transfer section 23. The process section 24 and the wafer transfer section 23 communicate each other through an opening 25. A fan 28 having a filter 27 is mounted on a partition wall 26 provided between the process section 24 and the wafer transfer section 23.

A cassette station 29 and a boat loading mechanism 30 are provided in the wafer transfer section 23. The cassette station 29 has a multiple of shelves, and a plurality of the wafer cassettes 22 are set on the respective shelves.

A heating furnace 31 having the heating apparatus shown in FIGS. 1 and 2 as a major component is arranged in the process section 24 to be located immediately above the opening 25 in the partition wall 26. A lower opening 31a of the heating furnace 31 and the opening 25 communicate each other.

The heating furnace 31 will be described in more detail with reference to FIG. 6. A process tube 70 is arranged in the heating furnace 31 to be surrounded by a coil heater 1. During processing, the lower opening of the process tube 70 is covered with a lid member 32. An heat-insulating cylinder 33 is placed on the lid member 32, and a vertical boat 34 is placed on the heat-insulating cylinder 33. A multiple of semiconductor wafers 35 are loaded in the boat 34.

The lid member 32 is supported by a support member 36 of the boat loading mechanism 30, and a nut of the support member 36 is threadably engaged with a ball screw 37.

A flange 38 is mounted on a lower opening end of the heat-insulating cylindrical member A. The flange 38 and a lower portion of the process tube 70 are fixed on a base 73 through bolts 74.

A gas supply pipe 71 and a gas exhaust pipe 72 are connected to the lower portion of the process tube 70 to supply and exhaust a process gas having predetermined components in and from the process tube 70, respectively.

A plurality of air supply pipes 39 are arranged around the heat process furnace 31 to extend into the furnace 31 in order to promote cooling of the interior of the furnace 31. The cooling air introduced in the furnace 31 through the air supply pipes 39 is discharged to the outside by a suction unit (not shown) through a heat exchanger 40 disposed at a top of the heat-insulating cylindrical member A.

Figure 7:
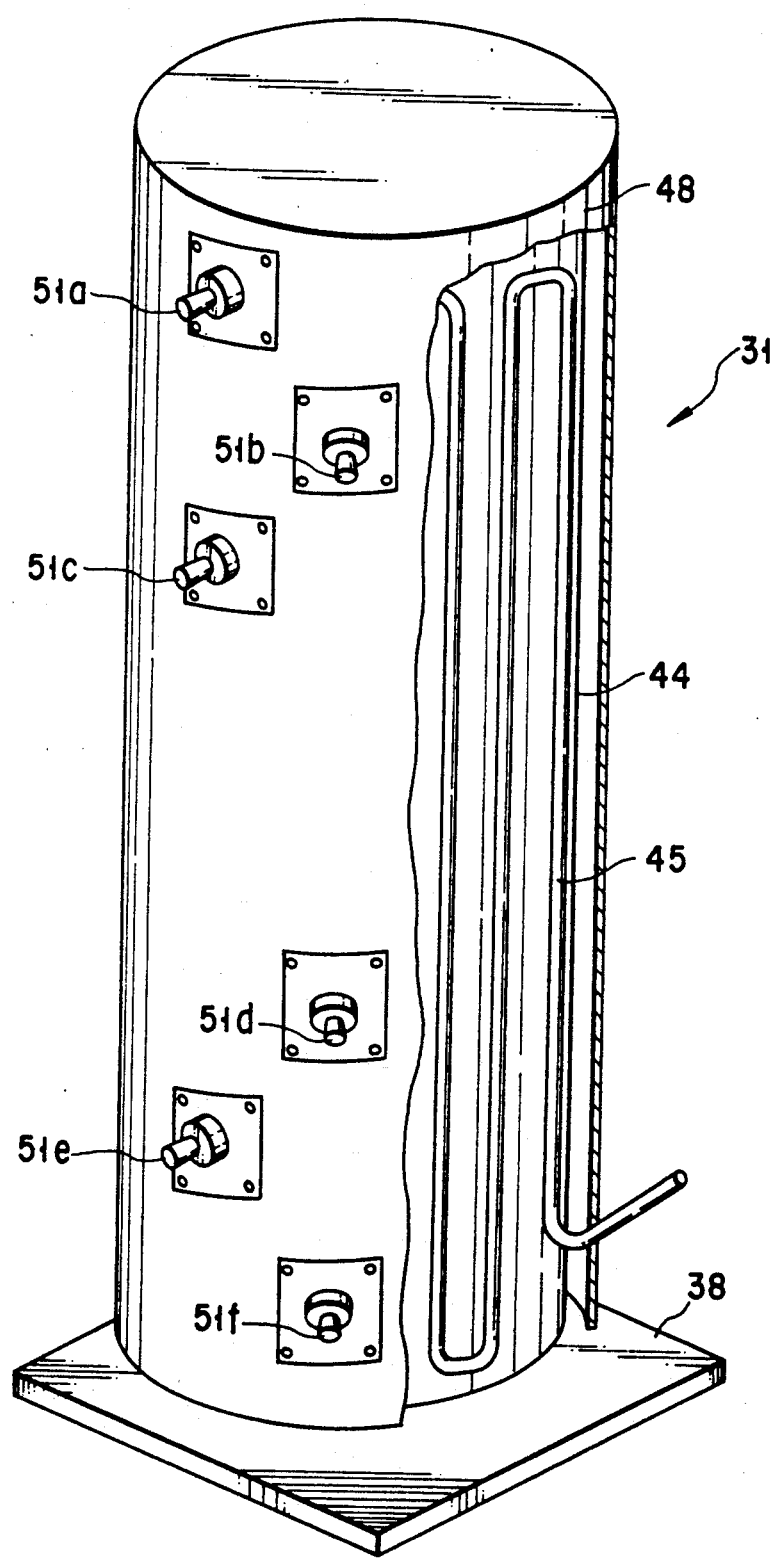
FIG. 7 is a partially cutaway perspective view showing an outer appearance of the furnace shown in FIG. 6.

As shown in FIG. 7, the circumferential surface of the heat process furnace 31 is covered by two covers 44 and 48 each constituted by a heat conductive material, e.g., a metal. A cooling pipe 45 constituted by a heat conductive material, e.g., a copper pipe is mounted on the outer surface of the inner cover 44 in a zig-zag manner. The cooling pipe 45 communicates with a cooling water source (not shown) to supply cooling water at a predetermined flow rate.

Three pairs of six terminals 51a to 51f externally extend from the outer cover 48. The pair of terminals 51a and 51b (first zone), the pair of terminals 51c and 51d (second zone), and the pair of terminals 51e and 51f (third zone) are connected to a power supply 60. In this manner, the coil heater 1 is constituted by at least three zones.

As shown in FIG. 7, the first zone having a height of about 100 mm is formed between the terminals 51a and 51b, the second zone having a height of 750 mm is formed between the terminals 51c and 51d, and the third zone having a height of 150 mm is formed between the terminals 51e and 51f. The respective terminals 51a to 51f are connected to the AC power supply 60 as shown in FIG. 6.

Referring to FIG. 6, thermocouples 62, 63, and 64 as temperature measuring elements are provided to the first, second, and third zones, respectively. The respective thermocouples 62, 63, and 64 are connected to an input terminal of a controller 61. The power supply 60 has the controller 61, and power supply amounts to the respective zones are controlled by the controller 61. In this manner, power supply to the first to third zones can be controllable, and a wide uniform heat range can be defined in the heating apparatus.

Figure 8:
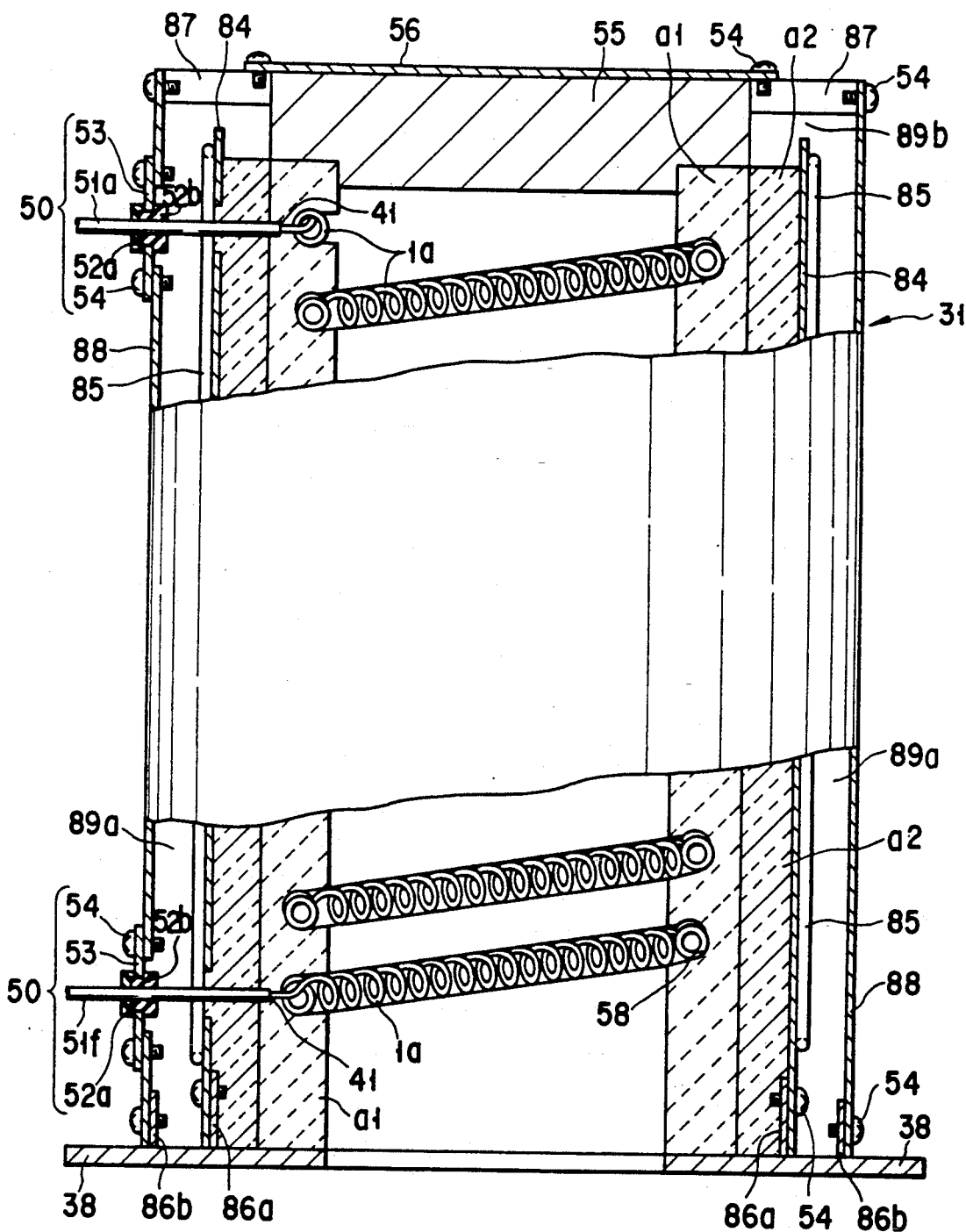
FIG. 8 is a partially sectional view showing a heating apparatus according to still another embodiment of the present invention.

FIG. 8 shows still another embodiment of the present invention.

The outer wall of a heat process furnace 31 consists of three layers, i.e., an inner layer portion $a_1$, an outer layer portion $a_2$, and an air layer 89a in the order from the inner side. A thick refractory 55 covers the ceiling of the furnace 31, and a stainless steel plate 56 covers the outer side of the refractory 55. The lower end portion of the furnace 31 is open, and a flange 38 made of a stainless steel plate is mounted on this open end portion.

A heater-retaining groove 58 is formed on the inner surface of the inner layer portion $a_1$, and a coil heater 1a is fitted or buried in the heater-retaining groove 58.

The lower portion of an inner cylinder 84 is fixed to the lower flange 38 through an annular support member 86a. The upper portion of the inner cylinder 84 is separated from the furnace ceiling through a gap 89b.

The upper portion of an outer cylinder 88 is fixed to the furnace ceiling through a spacer ring 87 made of a stainless steel. The lower portion of the outer cylinder 88 is mounted on the lower flange 38 through an annular support member 86b. Thus, an air layer 89a is defined between the inner and outer cylinders 84 and 88. Openings are formed at appropriate portions of the outer cylinder 88 to be connected to the terminals 51a to 51f in the same manner as shown in FIG. 7.

The coil heater 1a of the heat process furnace 31 is obtained by coiling a resistor heater wire made of an Fe-Cr-Al alloy. The coil heater 1a has a wire diameter of 2 mm, a coil diameter of 12 mm, and a coil pitch of 9.5 to 10 mm. The coiling shape of the coil heater 1a is not limited to a circular coil but can be of any type, e.g., an elliptic coil, as far as it has an annular form.

The respective terminals of the coil heater 1a are inserted in and welded on the terminals 51a to 51f of power supply terminal portions 50. In this case, terminal connecting portions 41 may be formed in advance, and the coil heater 1a having the terminals is buried in the inner layer portion $a_1$. The terminals 51a to 51f are made of the same material as or similar to that of the coil heater 1a. The diameter of each of the terminals 51a to 51f is larger than the wire diameter of the coil heater 1a, e.g., 6 mm.

The terminals 51a to 51f project to the outside of the outer cylinder 88 through the openings in the inner cylinder 84. Auxiliary plates 53 are mounted on the outer cylinder 88 each by four screw 54 to close the terminal connecting openings of the outer cylinder 88. The terminals 51a to 51f are threaded. A pair of insulators 52a and 52b are provided to sandwich each auxiliary plate 53, and the terminals 51a to 51f and the outer cylinder 88 are insulated from each other by the insulators 52a and 52b. The terminals 51a to 51f are fixed, in free from the inner cylinder 84 as shown in FIG. 8, to the outer cylinder 88. The reference numeral 85 denotes a cooling pipe which is mounted in the same manner as shown in FIG. 7.

The heating apparatus according to the present invention has the arrangement described above and thus can obtain effects as follows.

(1) Since the inner layer portion supporting the heating member uses the alumina fiber, it has a sufficiently high heat resistance as a heat resisting material. Since the inner layer portion has a high density, it exhibits an excellent strength. When a cooling gas is forcibly supplied to the heating apparatus, the inner layer portion has a high resistance to wind flap. Even when air is supplied at a high speed, dust from the heat-insulating material can be kept sufficiently small.

(2) Excellent heat-insulating performance can be obtained by the inner layer portion and the surrounding outer layer portion having a low density.

(3) When an outer layer portion having a low density is formed on the outer surface of the inner layer portion having a high density, excellent temperature stability can be obtained. That is, cracking caused by shrinkage can be controlled, and the furnace temperature can thus be stabilized.

(4) Since the heat-insulating layer consisting of the inner and outer layer portions has a small heat capacity as a whole, a quick heat response can be obtained, and quick heating and cooling can be performed.

(5) Although the inner and outer layer portions are made of different materials, since they form an integral layer having no joint, a variation does not easily occur in heat dissipation from the surface of this integral layer, and the furnace temperature can be easily stabilized to be kept at a predetermined value.

(6) Since the alumina fiber is used only in the inner layer portion, the manufacturing cost of the heat-insulating structure can be greatly decreased.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A heating apparatus comprising an integral layer including an inner layer portion comprising an alumina fiber, an inorganic filler, and an inorganic binder and having a bulk density of 0.3 to 0.8 g/cm$^3$ and an outer layer portion comprising an alumina silica fiber, and an inorganic binder and having a bulk density of 0.2 to 0.4 g/cm$^3$ which is smaller than that of said inner layer portion, wherein said inner layer portion serves as a support portion of a heating member.

2. An apparatus according to claim 1, wherein the alumina fiber contains 78 wt % of alumina.

3. An apparatus according to claim 1, wherein the alumina fiber, the inorganic filler, and the inorganic binder of said inner layer portion are mixed at a ratio of 20–65 parts alumina fiber, 35–70 parts inorganic filler and 3–10 parts inorganic binder.

4. An apparatus according to claim 1, wherein the alumina fiber, and the inorganic binder of said outer layer portion are mixed at a ratio of 85–95 parts alumina silica fiber and 5–15 parts inorganic binder.

5. An apparatus according to claim 1, wherein said inner layer portion further comprises the alumina silica fiber.

6. An apparatus according to claim 5, wherein the alumina fiber, the alumina silica fiber, the inorganic filler, and the inorganic binder of said inner layer portion are mixed at a ratio of 5–20 parts alumina fiber, 15–45 parts alumina silica fiber, 35–70 parts inorganic filler and 3–10 parts inorganic binder.

7. An apparatus according to claim 1, wherein a spiral groove is formed on said inner layer portion, and said heating member is fitted in the spiral groove.

8. An apparatus according to claim 1, wherein a support member projects from said inner layer portion, and said heating member is supported by said support member.

9. An apparatus according to claim 1, wherein said heating member is formed to have a coil shape.

10. An apparatus according to claim 1, wherein said heating apparatus is used as a furnace of a semiconductor manufacturing system.

* * * * *